United States Patent
Lynch et al.

(10) Patent No.: US 7,710,737 B2
(45) Date of Patent: May 4, 2010

(54) STIFFENING PLATE FOR CIRCUIT BOARD AND SWITCH ASSEMBLY

(75) Inventors: Stephen Brian Lynch, San Francisco, CA (US); Dinesh Mathew, Fremont, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 12/100,670

(22) Filed: Apr. 10, 2008

(65) Prior Publication Data

US 2009/0067140 A1    Mar. 12, 2009

Related U.S. Application Data

(60) Provisional application No. 60/967,816, filed on Sep. 7, 2007.

(51) Int. Cl.
*H05K 1/00* (2006.01)
(52) U.S. Cl. ............... 361/748; 174/520; 174/565; 174/135
(58) Field of Classification Search ........... 361/748; 200/303; 174/520, 565, 135, 66, 67
See application file for complete search history.

(56) References Cited

U.S. PATENT DOCUMENTS

| | | | | |
|---|---|---|---|---|
| 4,318,578 A | * | 3/1982 | Ericson et al. | 439/106 |
| 5,059,754 A | * | 10/1991 | Kaichi et al. | 200/332.1 |
| 5,213,204 A | * | 5/1993 | Sommer | 200/303 |
| 5,783,787 A | * | 7/1998 | Data | 200/5 R |
| 5,977,499 A | * | 11/1999 | Black et al. | 200/303 |
| 7,335,064 B2 | * | 2/2008 | Matsukawa et al. | 439/630 |

* cited by examiner

*Primary Examiner*—Jinhee J Lee
*Assistant Examiner*—Andargie M Aychillhum
(74) *Attorney, Agent, or Firm*—Kramer Levin Naftalis & Frankel LLP

(57) ABSTRACT

This invention is directed to a support plate for reinforcing a portion of a circuit board. The support plate may be coupled to a portion of the circuit board that is subject to forces (e.g., portions of the circuit board having switches) to prevent flexing of the board. The support plate may be coupled to the circuit board. This invention is also directed to a switch constructed from a button, a label plate, and a backer plate. The label plate and the backer plate may include apertures operative to receive a protrusion extending from the button, where the protrusion is welded to the backer plate. Labels may be printed or attached to the bottom surface of the label plate to protect the labels. In some embodiments, the protrusion may be welded to the backer plate. The protrusion may be operative to engage an electrical switch of an electronic device in which the switch is placed.

19 Claims, 3 Drawing Sheets

STIFFENING PLATE FOR CIRCUIT BOARD AND SWITCH ASSEMBLY

CROSS-REFERENCE TO RELATED APPLICATION

This application claims the benefit of prior filed U.S. Provisional Patent Application No. 60/967,816, filed Sep. 7, 2007, which is incorporated herein in its entirety.

BACKGROUND OF THE INVENTION

This invention is directed to a stiffening plate for an electronic device circuit board. This invention is also directed to a high cosmetic quality and low profile switch assembly.

SUMMARY OF THE INVENTION

In some embodiments, a system for strengthening a circuit board may be provided. The system may include a circuit board that has at least one switch operatively coupled to a button. The switch may also include a plate operative to be placed over the circuit board. The plate may include at least one aperture operative to receive the at least one switch, and at least one wing extending perpendicularly from the plate. The wing may include at least one prong operative to ground the circuit board, and may extend along the edge of the circuit board.

In some embodiments, a method for strengthening a circuit board of an electronic device may be provided. The method may include providing a circuit board that includes at least one switch operatively coupled to a button. The plate may be aligning with the circuit board, where the plate includes at least one aperture operative to receive the at least one switch and at least one wing extending perpendicularly from the plate. The plate may be coupled to the circuit board, where the at least one wing rests against the edge of the circuit board.

In some embodiments, a hold switch for use in an electronic device may be provided. The hold switch may include a button that includes a body and at least one protrusion, where the protrusion extends from the bottom surface of the body. The hold switch may also include a label plate that includes at least two labels printed on the lower surface of the plate. The hold switch may finally include a backer plate that includes at least one aperture operative to receive the at least one protrusion. The at least one protrusion may be operative to pass through the label plate and into the at least one aperture.

BRIEF DESCRIPTION OF THE DRAWINGS

The above and other features of the present invention, its nature and various advantages will be more apparent upon consideration of the following detailed description, taken in conjunction with the accompanying drawings, and in which.

DETAILED DESCRIPTION

Figure 1:
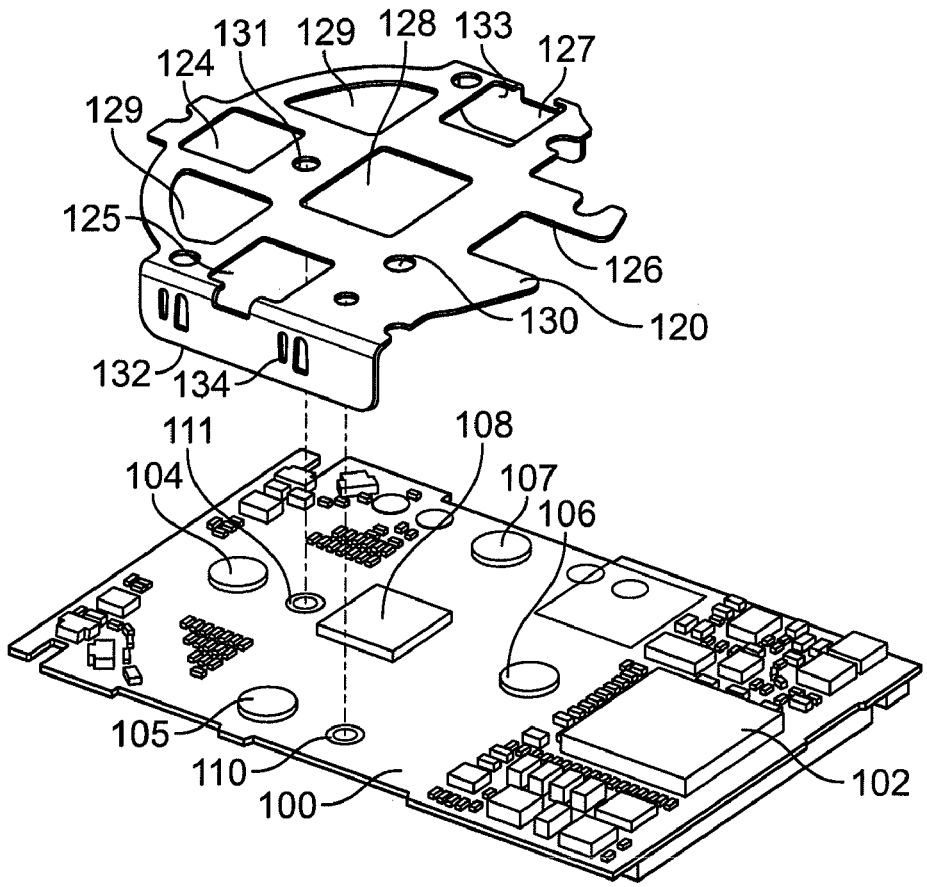
FIG. 1 is an exploded view of a circuit board and a stiffening plate in accordance with one embodiment of the invention.

FIG. 1 is an exploded view of a circuit board and a stiffening plate in accordance with one embodiment of the invention. Circuit board 100 may include several components 102 (e.g., processors, resistors, or memory) for performing operations of the electronic device in which circuit board 100 is placed. Circuit board 100 may include switches 104, 105, 106, 107 and 108 operative to be coupled to buttons for providing inputs to circuit board 100. In some embodiments, buttons may be placed directly over switches 104, 105, 106, 107 and 108 such that, as the user presses a button, the force exerted on the button is transferred to the respective switch and changes the state of the switch (e.g., changes the shape of the dome in a dome switch). If the force exceeds a maximum threshold, excess force may be transferred to board 100, causing board 100 to flex, which may cause board failure or other reliability issues.

To prevent board 100 from flexing in response to user inputs on buttons, board 100 may be constructed with a significant thickness. While such a solution may prevent board 100 from flexing, it may cause an inefficient use of space within the electronic device. This may be particularly problematic if the electronic device is small and space is at a premium. Another solution may be to reinforce only portions of board 100 where high amounts of flexing are expected. For example, board 100 may be reinforced in the areas surrounding switches 104, 105, 106, 107 and 108.

Board 100 may be reinforced using any suitable approach. In some embodiments, board 100 may be manufactured with varying thicknesses to add resistance to bending in portions of board 100 susceptible to bending forces. In some embodiments, an additional component may be added to board 100 to reinforce portions of board 100. For example, plate 120 may be coupled to board 100. Plate 120 may be constructed from any material having sufficient stiffness to reinforcing board 100. For example, plate 120 may be constructed from one of a metal (e.g., stainless steel), a plastic, a composite material, or any other suitable material. Plate 120 may be constructed with any suitable thickness, including for example a thickness that is less than the height of the tallest component 102 of board 100, or less than the tallest of switches 104, 105, 106, 107 and 108. By limiting the thickness of plate 120 to the height of the tallest component 102, the overall height needed to place board 100 in the electronic device may remain the same, whether plate 120 is coupled to board 100 or not.

In some embodiments, plate 120 may include wings 132 and 133 to provide additional stiffness to plate 120. Wings 132 and 133 may extend perpendicularly from the edge of plate 120 to provide additional strength against bending along the long axis of board 100. In some embodiments, at least one of wings 132 and 133 may include prongs 134 operative to contact the surface of the electronic device enclosure when board 100 and plate 120 are assembled in the electronic device. If prongs 134 (and plate 120) are constructed from an electrically conductive material, prongs 134 may be operative to provide a grounding path for board 100.

Plate 120 may include several apertures 124, 125, 126, 127 and 128 for receiving switches 104, 105, 106, 107 and 108, respectively. In some embodiments, plate 120 may also include other apertures 129 for receiving other components of board 100. Plate 120 may have any suitable shape. For example, plate 120 may be shaped to fit around components of board 100 such that plate 120 rests on unused areas of board 100. As another example, plate 120 may be shaped such that plate 120 is only added to the portion of board 100 to which high stresses are applied (e.g., the portions adjacent the switches). Plate 120 may include apertures 130 and 131 operative to be aligned with apertures 110 and 111 of board 100 to ensure that plate 120 is properly placed on board 120 and does not interfere with components 102. In some embodiments, one of apertures 130 and 131 and apertures 110 and 111 may be a pin operative to fit in an aperture. Wings 132 and 133 may rest against the edge of board 120 to further aid with the placement of plate 120 on board 100.

Figure 2:
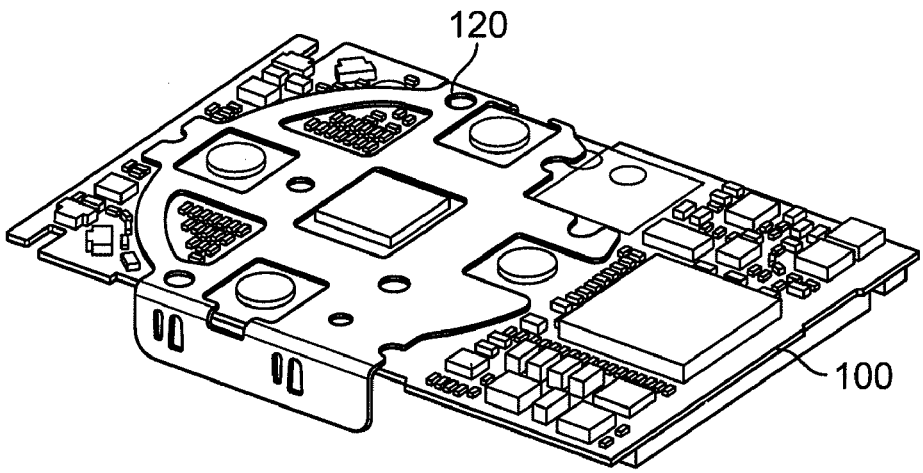
FIG. 2 is a perspective view of the board and plate of FIG. 1 when they are assembled in accordance with one embodiment of the invention.

FIG. 2 is a perspective view of the board and plate of FIG. 1 when they are assembled in accordance with one embodiment of the invention. Plate 120 may be coupled to board 100 using any suitable approach. For example, plate 120 may be coupled to board 100 using soldering (e.g., if plate 120 is metallic), surface mount technology (SMT), an adhesive, tape, a mechanical fastener (e.g., a screw), a mechanical coupling (e.g., a snap), or any other suitable approach. In some embodiments, the approach for coupling plate 120 to board 100 may further stiffen board 120 (e.g., by selecting an adhesive that is strong in bending or in shear). In some embodiments, plate 120 may include a plating or may be formed from a material enhancing the coupling to board 100 (e.g., a phosphorous bronze with nickel plating to enhance the soldering of plate 120 to board 100).

Figure 3:
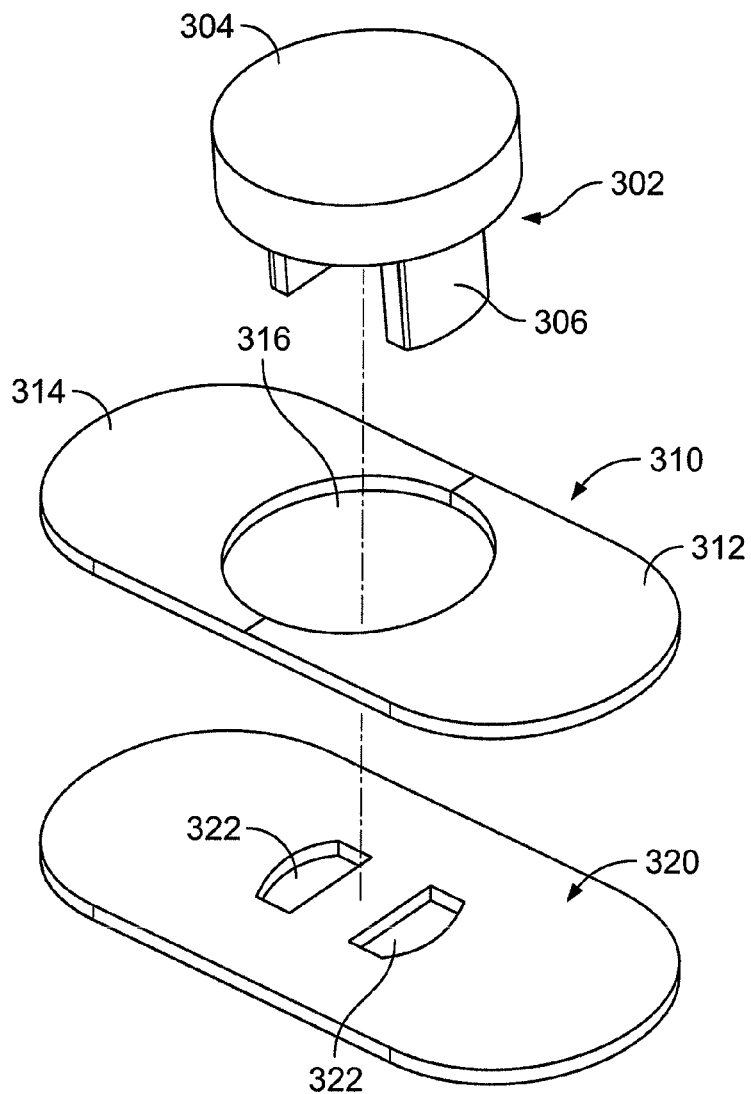
FIG. 3 is an exploded view of a switch assembly in accordance with one embodiment of the invention.

In some embodiments, the circuit board may be placed in an electronic device that has a small form factor. The electronic device may also include a low profile two position switch assembly that is contained within the electronic device for providing instructions to the circuit board. FIG. 3 is an exploded view of a switch assembly in accordance with one embodiment of the invention. Switch 300 may include button 302, label plate 310 and backer plate 320, such that switch 300 may be translated along the axis of plates 310 and 320 to provide different inputs to the electronic device. Button 302 may be any suitable button operative to be acted on by the user. In some embodiments, switch 300 may be constructed such that only the top portion of body 304 of button 302 extends beyond the outer surface of the electronic device case. Button 302 may be constructed from any suitable material, including for example metal, plastic, a composite material, or any other suitable material. In some embodiments, button 302 may be cylindrical to decrease manufacturing costs.

Button 302 may include body 304 and protrusions 306 operative to extend from the lower surface of button 302. Protrusions 306 may extend into the electronic device case and engage an electrical switch of the electronic device (e.g., a hold switch). In some embodiments, button 302 may include several protrusions 306 (e.g., two protrusions) such that as button 302 is displaced, at least one of each protrusion 306 is operative to contact and move the electrical switch of the electronic device.

Label plate 310 may be constructed from any suitable transparent or translucent material. For example, plate 310 may be constructed from glass or plastic. Plate 310 may include labels 312 and 314, which may have different colors. The size of each of labels 312 and 314, and the size of button 302 may be selected such that when button 302 is moved, only one of labels 312 and 314 is visible to the user. For example, the delimitation between labels 312 and 314 may be the middle of plate 310 (e.g., where button 302 is inserted in plate 310). Labels 312 and 314 may be coupled to plate 310 using any suitable approach. In some embodiments, labels 312 and 314 may be printed or attached using an adhesive or tape to the upper surface of plate 310. Plate 310 may then include an additional layer (e.g., hard-coating) to protect the indicator icons. In some embodiments, labels 312 and 314 may instead be printed or attached using an adhesive or tape to the lower surface of plate 310. In such embodiments, plate 310 may serve as a protective surface for layers 312 and 314. Plate 310 may include aperture 316 operative to receive a portion of button 302 (e.g., protrusions 306).

Backer plate 320 may be any suitable plate for coupling layer plate 310 to button 302 to form switch 300. In some embodiments, backer plate 320 may be coupled to plate 310. For example, plate 320 may be coupled to plate 310 using at least one of an adhesive, tape, a mechanical fastener, a mechanical feature (e.g., a snap), or any other approach. Plate 320 may include apertures 322 operative to receive protrusions 306 of button 302. Protrusions 306 may extend past the bottom surface of plate 320 such that protrusions 306 may engage an electronic switch of the electronic device.

Figure 4:
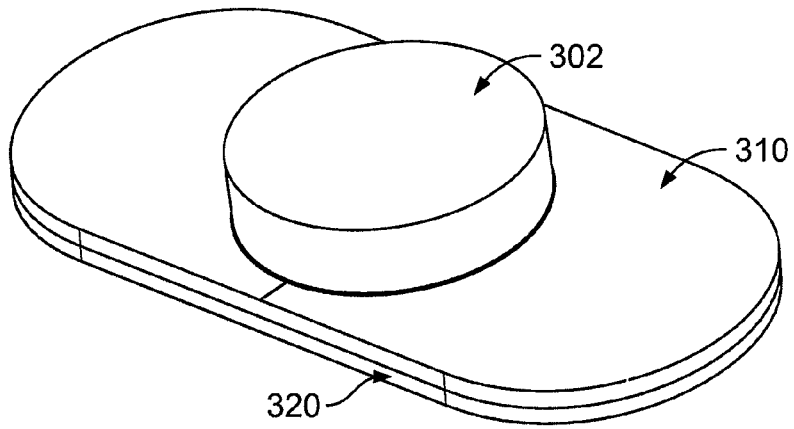
FIGS. 4 and 5 are perspective views of the switch of FIG. 3 when the switch is assembled in accordance with one embodiment of the invention.
Figure 5:
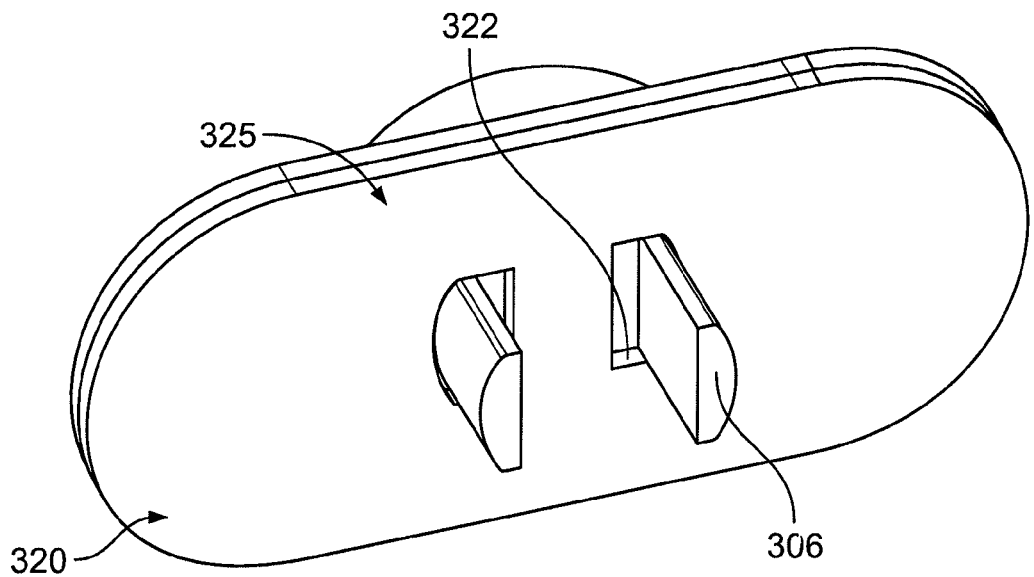

FIGS. 4 and 5 are perspective views of the switch of FIG. 3 when the switch is assembled in accordance with one embodiment of the invention. Protrusions 306 may be coupled to backer plate 320 using any suitable approach. For example, protrusions 306 may be coupled to plate 320 using at least one of an adhesive, tape, a press fit, a mechanical fastener, a mechanical feature (e.g., a snap), or any other approach. In some embodiments, protrusions 306 may be welded to plate 320 in apertures 322 (e.g., if button 302 and plate 320 are metallic). In some embodiments, body 304 may be operative to rest on the surface of plate 310 when button 302 extends into plate 320. The diameter of body 304 may be selected such that body 304 hides the delimitation of labels 312 and 314 when switch 300 is assembled (e.g., for cosmetic purposes). Body 304 may be coupled to plate 310 using any suitable approach, including for example using an adhesive, tape, a mechanical coupling, or a press fit.

Figure 6:
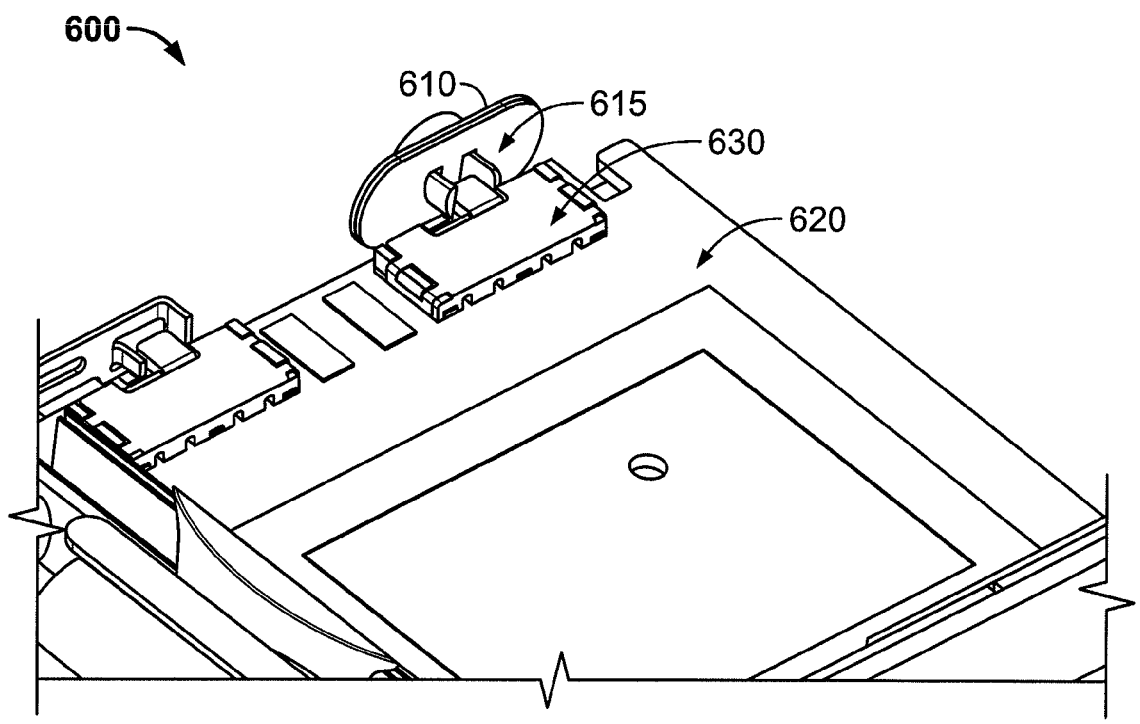
FIG. 6 is a schematic view of a switch assembly assembled in an electronic device in accordance with one embodiment of the invention.

FIG. 6 is a schematic view of a switch assembly assembled in an electronic device in accordance with one embodiment of the invention. Electronic device 600 may include switch 610, which may include protrusions 615 operative to engage electrical switch 630. Electrical switch 630 may be coupled to circuit board 620 to provide user inputs to the electronic device circuitry.

When placed in electronic device 600, the edges of switch 600 (e.g., the periphery of label plate 310, FIG. 3) may be hidden from the user's view by the outer surface of electronic device 600. For example, the outer surface of electronic device 600 may include a slot that has a width equal to the diameter of button 302 (FIG. 3). By hiding the edge of label plate 302 and the delimitation between labels 312 and 314 (FIG. 3), the portions of switch 600 visible to the user may be aesthetically pleasing.

What is claimed is:

1. A system for strengthening a circuit board, comprising:
    a circuit board comprising at least one switch operatively coupled to a button;
    a plate operative to be placed over the circuit board, wherein the plate reinforces a portion of the circuit board, the plate comprising:
        at least one aperture operative to receive the at least one switch;
        at least one wing extending perpendicularly from the plate, the wing comprising at least one prong operative to ground the circuit board.
2. The system of claim 1, wherein the thickness of the plate does not exceed the height of the tallest component coupled to the circuit board.

3. The system of claim 1, wherein the plate is operative to be placed over unused surfaces of the circuit board.

4. The system of claim 1, wherein the plate is coupled to the circuit board using at least one of soldering, surface mount technology, adhesive, and tape.

5. A method of strengthening a circuit board of an electronic device, comprising:
- providing a circuit board comprising at least one switch operatively coupled to a button;
- aligning a plate with the circuit board, wherein the plate comprises at least one aperture operative to receive the at least one switch and at least one wing extending perpendicularly from the plate;
- placing at least one prong extending from the at least one wing in contact with the electronic device case to ground the circuit board; and
- coupling the plate to the circuit board to reinforce the circuit board, wherein the at least one wing rests against the edge of the circuit board.

6. The method of claim 5, wherein coupling the plate to the circuit board further comprises coupling the plate to the circuit board using at least one of soldering, surface mount technology, an adhesive, and tape.

7. The method of claim 5, wherein aligning a plate with the circuit board further comprises aligning an aperture of the plate with a pin of the circuit board.

8. The method of claim 5, wherein the thickness of the plate does not exceed the height of the tallest component coupled to the circuit board.

9. A strengthening plate for use with an electronic device circuit board, comprising:
- a substantially planar plate coupled to a surface of a circuit board to reinforce at least one portion of the circuit board; wherein the planar plate comprises at least one opening through which a circuit board component can extend; and
- a wing extending perpendicular from an edge of the planar plate, wherein the wing comprises at least one prong operative to ground the circuit board.

10. The strengthening plate of claim 9, wherein the wing is constructed from an electrically conductive material.

11. The strengthening plate of claim 9, wherein the wing is operative to contact the surface of an electronic device enclosure surrounding the circuit board.

12. The strengthening plate of claim 9, wherein the thickness of the planar plate is less than the height of the circuit board.

13. The strengthening plate of claim 9, wherein the planar plate is operative to resist displacement in response to a force applied to the circuit board component.

14. The strengthening plate of claim 9, wherein the planar plate selectively reinforces the at least one portion of the circuit board.

15. The strengthening plate of claim 14, wherein the at least one selectively reinforced portion is a portion of the circuit board to which high stresses are applied.

16. The strengthening plate of claim 14, wherein the at least one selectively reinforced portion is a portion of the circuit board where high amounts of circuit board flexing are expected.

17. A system for strengthening a circuit board, comprising:
- a circuit board comprising at least one circuit board component; and
- a substantially planar plate coupled to a surface of the circuit board, wherein the planar plate reinforces at least one portion of the circuit board, the planar plate comprising:
  - at least one opening through which the at least one circuit board component can extend; and
  - a wing extending perpendicular from the plate, wherein the wing comprises at least one prong operative to ground the circuit board.

18. The system of claim 17, wherein the wing is operative to contact the surface of an electronic device enclosure surrounding the circuit board.

19. The system of claim 17, wherein the planar plate is operative to resist displacement in response to a force applied to the circuit board component.

* * * * *

UNITED STATES PATENT AND TRADEMARK OFFICE
CERTIFICATE OF CORRECTION

| | | |
|---|---|---|
| PATENT NO. | : 7,710,737 B2 | Page 1 of 1 |
| APPLICATION NO. | : 12/100670 | |
| DATED | : May 4, 2010 | |
| INVENTOR(S) | : Stephen Brian Lynch et al. | |

It is certified that error appears in the above-identified patent and that said Letters Patent is hereby corrected as shown below:

In column 5, line 35, in Claim 9, delete "board;" and insert -- board, --, therefor.

Signed and Sealed this
Fifteenth Day of November, 2011

David J. Kappos
*Director of the United States Patent and Trademark Office*